United States Patent
Palaniappan

[11] Patent Number: 5,223,779
[45] Date of Patent: Jun. 29, 1993

[54] HIGH EFFICIENCY SWITCHING CIRCUIT FOR TRANSFERRING ENERGY STORED WITHIN A SNUBBING CIRCUIT TO AN ELECTRICAL LOAD

[75] Inventor: Rasappa Palaniappan, Michigan City, Ind.

[73] Assignee: Sundstrand Corporation, Rockford, Ill.

[21] Appl. No.: 606,570

[22] Filed: Oct. 31, 1990

[51] Int. Cl.⁵ .............................................. H02P 7/00
[52] U.S. Cl. ........................................ 318/701; 318/811
[58] Field of Search ............... 318/701, 811, 799-810, 318/138, 139, 439, 254; 363/163, 135-138, 41, 101

[56] References Cited

U.S. PATENT DOCUMENTS

| | | | |
|---|---|---|---|
| 3,808,481 | 4/1974 | Rippel | 318/139 |
| 3,890,551 | 6/1975 | Plunkett | 318/132 |
| 4,143,308 | 3/1979 | Deplante et al. | 318/138 |
| 4,404,512 | 9/1983 | Greenwell | 318/807 |
| 4,520,279 | 5/1985 | Glennon | 312/75 X |
| 4,528,456 | 7/1985 | Harris | 318/254 X |
| 4,684,867 | 8/1987 | Miller et al. | 318/701 |
| 4,697,230 | 9/1987 | Neft | 363/163 |
| 4,731,570 | 3/1988 | Lee | 318/696 |
| 4,763,056 | 8/1988 | Byrne et al. | 318/701 |
| 4,896,089 | 1/1990 | Kliman et al. | 318/701 |
| 4,910,450 | 3/1990 | Parker et al. | 318/811 |
| 5,039,924 | 8/1991 | Avitan | 318/139 |

Primary Examiner—Jonathan Wysocki
Attorney, Agent, or Firm—Antonelli, Terry, Stout & Kraus

[57] ABSTRACT

A switching circuit (10) in accordance with the invention includes a snubbing circuit (12) which couples energy stored in energy storing elements (24), (28) and (36) to the switching circuit. A capacitive storage (20), coupled to a DC potential (16), supplies electrical current which flows to an electrical load (18) through at least one switch (14) which is coupled to the snubbing circuit.

27 Claims, 1 Drawing Sheet

HIGH EFFICIENCY SWITCHING CIRCUIT FOR TRANSFERRING ENERGY STORED WITHIN A SNUBBING CIRCUIT TO AN ELECTRICAL LOAD

DESCRIPTION

1. Technical Field

The present invention relates to snubbing circuits.

2. Background Art

A snubbing circuit is a suppression network which controls the maximum rate of change of voltage and peak voltage across one or more switching circuits. Snubbing circuits limit the peak voltage and the maximum rate of change of voltage with a combination of resistance, capacitance and diodes which are connected either in parallel or in series or in series/parallel configurations with the switching device which is being snubbed.

Switches waste considerable energy during switching including losses attributable to the operation of a snubbing circuit connected to a switch. Capacitors in snubbing networks store charge during the switching of the switching circuit which is later discharged through a resistance. The snubbing action of the capacitor represents wasted energy when the capacitor discharges through a resistor which lowers operational efficiency of the switching circuit and generates heat which can cause problems in the operation of the switching circuit. An inductor in a snubbing circuit connected with the switch that is being switched on and off limits the rate of change of current as a function of time of current flowing through the switch during switching. The energy built up in the magnetic field in an inductor during switching of the switch generates a high potential which opposes the collapse of the magnetic field built up in the inductor during steady state current flow. The induced high voltage potential also represents wasted energy which contributes to inefficiency in the operation of the switching circuit and also generates excessive heat.

Variable reluctance motors operate on the principle of switching on and off current flow through i? one or more phase windings of the variable reluctance motor. It is desirable to switch the flow of current in a phase winding off no later than when a salient pole of a rotor has rotated to an aligned position with a salient pole of the stator which represents the minimum reluctance position. It is desirable to rapidly switch off the flow of current in a phase of a variable reluctance motor to produce maximum torque. As a result, switching circuits for a variable reluctance motors are designed to have rapid turn on and turn off characteristics in which snubbing circuits are used to protect the switches against excessive voltage or a rate of change of voltage during switching.

It is known to operate variable reluctance motors such that magnetic energy stored in the windings of a phase of a variable reluctance motor is returned to the power supply through circuits which return the generated potential to the power supply instead of dissipating it as wasted energy. An example of a regenerative circuit in variable reluctance motor drives which return generated electrical energy back to the power supply is disclosed in U.S. Pat. No. 4,684,867. However, the regenerative operation of a variable reluctance motor drive to return generated electrical energy from the phase windings of the variable reluctance motor to the DC power supply does not involve the return of energy from a snubbing circuit to the DC power supply. When switching high currents such as applications where variable reluctance motors are driving high loads it is necessary to protect the switching circuits against excessive electrical potentials and the rate of change of electrical potential to avoid damage of the switching elements. As a result, the failure to return energy stored in the snubbing circuit during switching lowers the overall operational efficiency of the switching circuit and further generates excessive heat.

DISCLOSURE OF INVENTION

The present invention is a switching circuit for switching current flow through an electrical load to control current flow through the electrical load which utilizes a snubbing circuit for controlling a voltage dropped across at least one switch during switching of the at least one switch which charges a capacitive storage coupled to a DC potential supplying current flow to the at least one switch which is charged through a coupling circuit coupled to the snubbing circuit for coupling electrical energy to the capacitive storage which is stored in the snubbing circuit during switching of the at least one switch. With the invention, electrical energy stored in the snubbing circuit by storing charge on a capacitor and in a magnetic field built up in an inductor coupled to the flow of current from the DC power supply to the switch is coupled to the capacitive storage through the energy return circuit. The capacitive storage is comprised of at least one capacitor and preferably first and second capacitors which are electrically coupled together by a switch when the switch is conductive. The first capacitor is charged with energy built up in at least one capacitor coupled to the switch and in an inductor coupled between the DC potential and the switch. A control circuit controls the conductivity of the switch disposed between the first and second capacitors such that the control switch is turned on to provide a path for charge to flow from the first capacitor to the second capacitor and which prevents charge flow from the first capacitor to the second capacitor when the control switch is turned off. A control circuit causes the control switch to turn on when the voltage stored on the first capacitor is above a first threshold voltage greater than the DC potential connected to the switch which is being snubbed and to turn off when the voltage stored on the first capacitor is below a second threshold greater than the DC potential with the second threshold being less than the first threshold. The charge stored on the second capacitor is coupled to the at least one switch which is being snubbed when the potential of the charge stored on the second capacitor is greater than the DC potential.

A switching circuit for switching current flow through an electrical load to control current flow through the electrical load in accordance with the invention includes at least one switch which is switched between conductive and non-conductive states by a drive circuit; a snubbing circuit coupled to the at least one switch for controlling a voltage dropped by the at least one switch during switching of the at least one switch; a DC potential coupled to the at least one switch which provides current flow to the electrical load during switching of the at least one switch; a capacitive storage, coupled to the DC potential, for storing charge which is additive to the DC potential when an electrical potential of the stored charge is higher than the DC potential; and a coupling circuit, coupled to the snubbing circuit, for coupling electrical energy to the capacitive storage which is stored in the snubbing circuit during switching of the at least one switch. The snubbing circuit comprises an inductor in series with the at least one switch for controlling a rate of change of current as a function of time through the at least one switch; and a terminal of the inductor which develops a potential during switching of the at least one switch with a polarity additive to a polarity with which the capacitive storage charge is coupled to the capacitive storage to cause the capacitive storage to be charged with a potential dropped across the inductor during switching. Each of the at least one switch has a series circuit of a capacitor and a diode coupled in parallel to power electrodes of the switch which is part of the snubbing circuit; and a terminal of the capacitor of each series circuit which is charged during switching of the at least one switch with a polarity additive to a polarity with which the capacitive storage is charged is coupled to the capacitive storage to transfer charge from the capacitor of each series circuit to the capacitive storage. Alternatively, each of the at least one switch has a parallel circuit having a series circuit comprising a capacitor and resistor in parallel with a diode coupled to a power electrode of the switch which is part of the snubbing circuit; and a terminal of the capacitor of each parallel circuit is charged during switching of the at least one switch with a polarity which is additive to a polarity with which the capacitive storage is charged is coupled to the capacitive storage to transfer charge from the capacitor of each parallel circuit to the capacitive storage. Preferably, energy is returned to the capacitive storage from the inductor and the capacitors of the series and parallel circuits.

The capacitive storage comprises a first capacitor o which is coupled to the snubbing circuit having a terminal which has a polarity additive to the DC potential; and a second capacitor, coupled to the first capacitor, which is charged from charge transferred from the first capacitor, and to the DC potential, for providing charge to the at least one switch when a potential stored across the second capacitor is greater than the DC potential. A control switch is disposed between the first and second capacitors which is turned on to provide a path for charge to flow from the first capacitor to the second capacitor and which prevents charge flow from the first capacitor to the second capacitor when the control switch is turned off. A control circuit causes the control switch to turn on when the voltage stored on the first capacitor is above a first threshold voltage greater than the DC potential and to turn off when the voltage stored on the first capacitor is below a second threshold greater than the DC potential with the second threshold being less than the first threshold. A diode and inductor are coupled between the snubbing circuit and the first capacitor for preventing charge from flowing from the first capacitor to the snubbing circuit and controlling a rate at which the first capacitor is charged by the snubbing circuit; and a diode and inductor is coupled between the first and second capacitors for preventing charge from flowing from the second capacitor to the first capacitor and controlling a rate at which the second capacitor is charged from the first capacitor.

In a snubbing circuit coupled to at least one switch for controlling a voltage dropped by the at least one switch during switching to control current flow through a load an improvement in accordance with the present invention includes a DC potential coupled to the at least one switch which provides current flow to the electrical load during switching of the at least one switch; a capacitive storage, coupled to the DC potential, for storing charge providing an electrical potential charge, which is added to the DC potential when the potential of the stored charge is higher than the DC potential; and a coupling circuit coupled to the snubbing circuit, for coupling electrical energy to the capacitive storage which is stored in the snubbing circuit during switching of the at least one switch.

A method of operating a snubbing circuit coupled to the at least one switch controlling flow of current through an electrical load in accordance with the invention includes coupling electrical energy to a capacitive storage which is stored in the snubbing circuit during switching of the at least one switch; and coupling electrical energy in the capacitive storage to the at least one switch when a potential at which the electrical energy is stored in the capacitive storage is greater than a DC potential which supplies current flowing to the electrical load which is switched by the at least one switch.

BEST MODE FOR CARRYING OUT THE INVENTION

Figure 1:
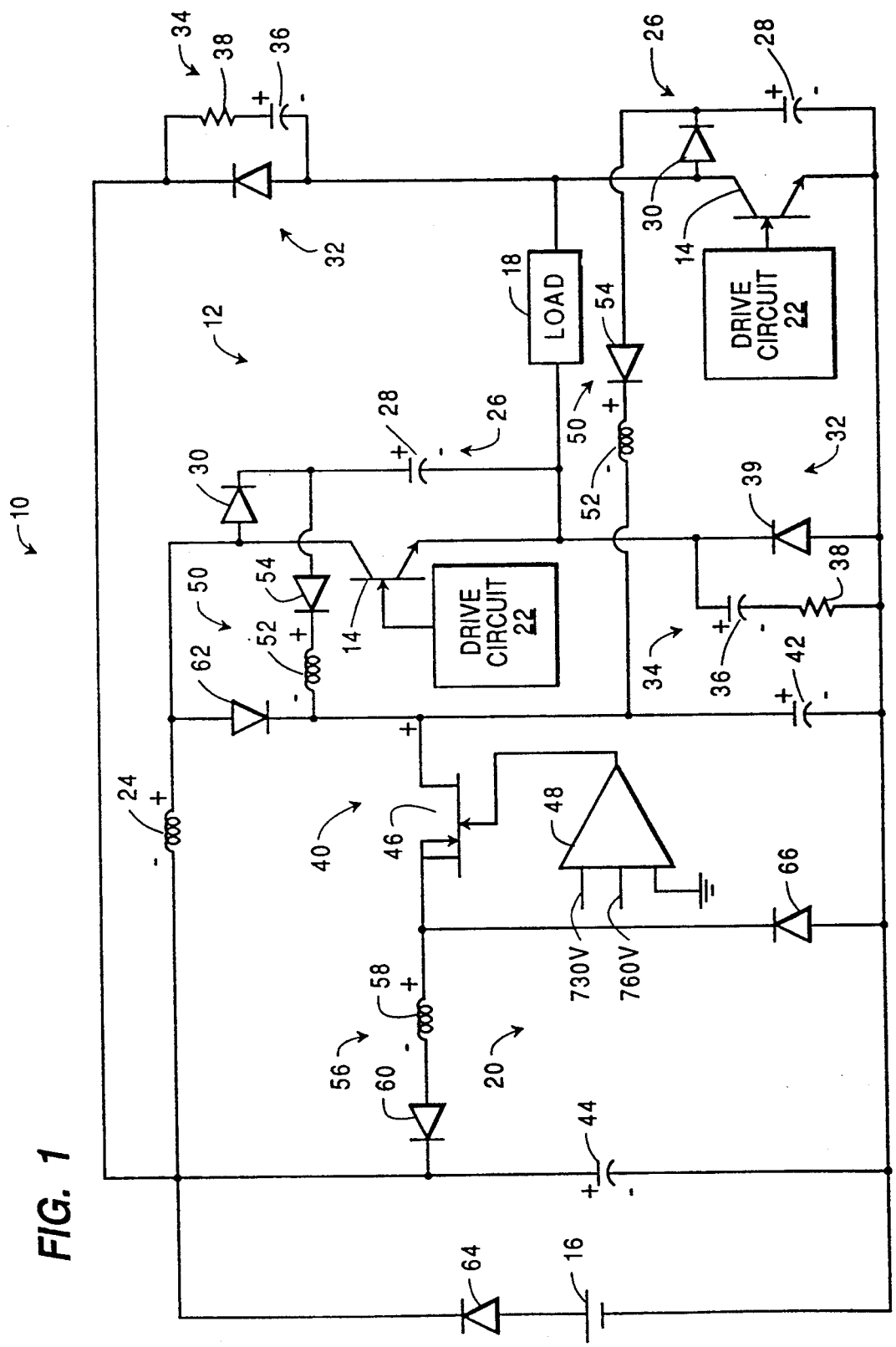
FIG. 1 illustrates a switching circuit in accordance with the present invention.

FIG. 1 illustrates a switching circuit 10 in accordance with the present invention which couples electrical energy stored in a snubbing circuit connected to at least one switch 14, which switches the flow of current from a DC potential 16 to an electrical load 18, to a capacitive storage 20. As a result, energy absorbed by the snubbing circuit is returned to the electrical load 18 instead of being wasted as heat generated by discharging of capacitors or the collapsing magnetic field produced by an inductor contained within the snubbing circuit 12.

The present invention is not limited to any particular form of snubbing circuit with energy being returned from at least one energy storage element which may be an inductor and/or capacitor contained in the snubbing circuit to the capacitive storage 20. Conventional drive circuits 22 control the switching of the switches 14 between conductive and non-conductive states to control the flow of current from the DC potential 16 to the electrical load 18 in accordance with the application of the switching circuit. The present invention is preferably used in controlling the flow of current in one or more phase windings of a variable reluctance electrical motor. The snubbing circuit 12 includes inductor 24 which controls the rate of change of current flow (di/dt) through the switches 14 to prevent damage by an excessively large rate of change of current flow. The magnitude of the inductance of inductor 24 is determined by the characteristics of the switches 14 and the electrical load 18. The snubbing circuit 12 also includes a series circuit comprised of a capacitor 28 and a diode 30. The capacitor 28 prevents an excessive voltage from being applied across the power terminals of the switches 14. Diode 30 controls the polarity of the charge stored by capacitor 28. The snubbing circuit 12 also includes a parallel circuit 32 having a series circuit 34 comprised of capacitor 36 and resistor 38 in parallel with diode 39 which prevents dropping of excessive potential across the switches 14.

A coupling circuit 40 couples electrical energy stored in inductor 24, capacitors 28 during switching of the switches 14 to a first capacitor 42 and to a second capacitor 44 as described below. The coupling circuit couples the inductor 24, capacitors 28 to the first capacitor 42 and the first capacitor to the second capacitor 44 when a control switch 46 is conductive. Control circuit 48 controls the conductivity of the control switch to cause the control switch 46 to be conductive when the voltage stored on the first capacitor 42 is above a first threshold which may be, for example, 760 volts when the DC potential 16 is 700 volts and to turn off when the voltage stored on the first capacitor is below a second threshold greater than the DC potential which may, for example, be 730 volts with the second threshold being less than the first threshold. The control circuit 48 preferably is a comparator but the invention is not limited thereto. A series circuit 50 comprised of inductor 52 and diode 54 controls the rate at which the capacitor 28 is discharged into the first capacitor 42. Series circuit 56 comprised of inductor 58 and diode 60 controls the rate at which the first capacitor 42 discharges into the second capacitor 44.

Diode 62 prevents the discharging of capacitor 28 back through the switch 14; diode 64 prevents the flow of charge from the second capacitor 44 into the DC potential 16; and diode 66 provides a path for inductor 58 current when switch 46 turns off.

The relative magnitudes of the inductances and capacitances in the switching circuit 10 may be varied in accordance with the desired mode of operation. However, the ratio of the capacitance of the first capacitor 42 to the capacitors 28 may be in the order of 50:1, and the ratio of the capacitance of the second capacitor 44 to the first capacitor may be in the order of 50:1. The ratio of the inductance of the inductors 24 and 52 may be in the order of 25:1. The aforementioned ratio of capacitances insures that the voltage on the second capacitor 44 is not substantially influenced by rapid changes of voltage on the first capacitor 42 and similarly, the voltage on the first capacitor is not influenced by rapid variation in the voltage on the capacitors 28. The ratio of the inductances of the inductor 24 and 52 insures that the inductor 52 prevents high pulse current build up as a consequence of discharging of the capacitors 28 into the first capacitor 42.

It should be noted that the potential of the terminals of the inductor 24, capacitors 28, the first capacitor 24 and the second capacitor 44, which are biased positive, is additive to the potential of the DC potential 16 in supplying current to the electrical load 18 through the switches 14.

The switching circuit 10 operates as follows. The opening and closing of the switches 14 is under the control of the drive circuits 22 dependent upon the particular application which determines the characteristics of the electrical load 18. As stated above, a preferred application of the present invention is in switching the windings of one or more phases in a variable reluctance motor. The switching on and off of the switches 14 causes energy to be stored in the capacitors 28 and 36 and in the magnetic field produced by current flow through the inductor 24. The energy stored in the capacitors 28 is coupled to the first capacitor 42. The energy stored in the capacitor 36 located in the bottom part of FIG. 1 is coupled to the first capacitor 42 through the circuit comprised of the capacitor 28 associated with the switch 14 located in the center of FIG. 1 and the series circuit 50 comprised of inductor 52 and diode 54. Energy stored in the capacitor 36 in the top right-hand corner of FIG. 1 is returned directly to the second capacitor 44 through resistor 38. Turning off of the switches 14 under the control of the drive circuits 22 causes an abrupt drop in the current flow which induces a high potential in the inductor 24 with the polarity as noted. This polarity forward biases diode 62 which charges the first capacitor 42. Electrical energy is coupled to the capacitive storage 20 which is stored in the snubbing circuit during switching of the at least one switch 14. The electrical energy stored in the capacitive storage 20, which includes at least one capacitor and preferably includes at least first and second capacitors 42 and 44, is coupled to the at least one switch 14 when a potential at which the electrical energy is stored in the capacitive storage is greater than the DC potential 16 which supplies current flowing to the electrical load which is switched by the at least one switch.

While the invention has been described in terms of its preferred embodiment, it should be understood that numerous modifications may be made thereto without departing from the spirit and scope of the invention as defined in the appended claims. For example, while a preferred application of the present invention is controlling the current flow in the windings of a variable reluctance motor having at least one phase, it should be understood that the present invention has applications in any switching circuit using snubbing circuits in which substantial energy is stored in the snubbing circuits during switching in which it is desired to increase the overall operational efficiency of the snubbing circuit by preventing dissipation of the energy stored in the snubbing circuit. It is intended that all such modifications fall within the scope of the appended claims.

We claim:

1. A switching circuit for switching current flow through an electrical load to control current flow through the electrical load comprising:
   at least one switch which is switched between conductive and non-conductive states by a drive circuit;
   a snubbing circuit coupled to the at least one switch for controlling a voltage dropped by the at least one switch during switching of the at least one switch;
   a DC potential coupled to the at least one switch which provides current flow to the electrical load during switching of the at least one switch;
   a capacitive storage, coupled to the DC potential, for storing charge which is additive to the DC potential when an electrical potential of the stored charge is higher than the DC potential; and
   a coupling circuit, coupled to the snubbing circuit, for coupling electrical energy to the capacitive storage which is stored in the snubbing circuit during switching of the at least one switch.

2. A switching circuit in accordance with claim 1 wherein the snubbing circuit comprises:
   an inductor in series with the at least one switch for controlling a rate of change of current as a function of time through the at least one switch; and
   a terminal of the inductor which develops a potential during switching of the at least one switch with a polarity additive to a polarity with which the capacitive storage stores charge is coupled to the capacitive storage to cause the capacitive storage to be charged with a potential dropped across the inductor during switching.

3. A switching circuit in accordance with claim 1 wherein:
   each of the at least one switch has a series circuit of a capacitor and a diode coupled in parallel to power electrodes of the switch which is part of the snubbing circuit; and
   a terminal of the capacitor of each series circuit which is charged during switching of the at least one switch with a polarity is additive to a polarity with which the capacitive storage is charged is coupled to the capacitive storage to transfer charge from the capacitor of each series circuit to the capacitive storage.

4. A switching circuit in accordance with claim 2 wherein:
   each of the at least one switch has a parallel circuit having a series circuit comprising a capacitor and resistor in parallel with a diode coupled to a power electrode of the switch which is part of the snubbing circuit; and
   a terminal of the capacitor of each parallel circuit is charged during switching of the at least one switch with a polarity which is additive to a polarity with which the capacitive storage is charged is coupled to the capacitive storage to transfer charge from the capacitor of each parallel circuit to the capacitive storage.

5. A switching circuit in accordance with claim 1 wherein the snubbing circuit comprises:
   an inductor in series with the at least one switch for controlling a rate of charge of current as a function of time through the at least one switch; and
   a terminal of the inductor which develops a potential during switching of the at least one switch with a polarity additive to a polarity with which the capacitive storage stores charge is coupled to the capacitive storage to cause the capacitive storage to be charged with a potential dropped across the inductor during switching; and wherein
   each of the at least one switch has a series circuit of a capacitor and a diode coupled in parallel to power electrodes of the switch which is part of the snubbing circuit;
   a terminal of the capacitor of each series circuit which is charged during switching of the at least one switch with a polarity is additive to a polarity with which the capacitive storage is charged is coupled to the capacitive storage to transfer charge from the capacitor of each series circuit to the capacitive storage;
   each of the at least one switch has a parallel circuit having a series circuit comprising a capacitor and resistor in parallel with a diode coupled to a power electrode of the switch which is part of the snubbing circuit; and
   a terminal of the capacitor of each parallel circuit is charged during switching of the at least one switch with a polarity which is additive to a polarity with which the capacitive storage is charged is coupled to the capacitive storage to transfer charge from the capacitor of each parallel circuit to the capacitive storage.

6. A switching circuit in accordance with claim 1 wherein the capacitive storage comprises:
   a first capacitor which is coupled to the snubbing circuit having a terminal which has a polarity additive to the DC potential; and
   a second capacitor, coupled to the first capacitor, which is charged from charge transferred from the first capacitor, and to the DC potential, for providing charge to the at least one switch when a potential stored across the second capacitor is greater than the DC potential.

7. A switching circuit in accordance with claim 6 further comprising:
   a control switch disposed between the first and second capacitors which is turned on to provide a path for charge to flow from the first capacitor to the second capacitor and which prevents charge flow from the first capacitor to the second capacitor when the control switch is turned off.

8. A switching circuit in accordance with claim 7 further comprising:
   a control circuit for causing the control switch to turn on when the voltage stored on the first capacitor is above a first threshold voltage greater than the DC potential with the second threshold being less than the first threshold.

9. A switching circuit in accordance with claim 8 further comprising:
   a diode and inductor coupled between the snubbing circuit and the first capacitor for preventing charge from flowing from the first capacitor to the snubbing circuit and controlling a rate at which the first capacitor is charged by the snubbing circuit; and
   a diode and inductor coupled between the first and second capacitors for preventing charge from flowing from the second capacitor to the first capacitor and controlling a rate at which the second capacitor is charged from the first capacitor.

10. A switching circuit in accordance with claim 2 wherein the capacitive storage comprises:
    a first capacitor which is coupled to the snubbing circuit having a terminal which has a polarity additive to the DC potential; and
    a second capacitor, coupled to the first capacitor, which is charged from charge transferred from the first capacitor, and to the DC potential, for providing charge to the at least one switch when a potential stored across the second capacitor is greater than the DC potential.

11. A switching circuit in accordance with claim 10 further comprising:
    a control switch disposed between the first and second capacitors which is turned on to provide a path for charge to flow from the first capacitor to the second capacitor and which prevents charge flow from the first capacitor to the second capacitor when the control switch is turned off.

12. A switching circuit in accordance with claim 11 further comprising:
    a control circuit for causing the control switch to turn on when the voltage stored on the first capacitor is above a first threshold voltage greater than the DC potential with the second threshold being less than the first threshold.

13. A switching circuit in accordance with claim 12 further comprising:
    a diode and inductor coupled between the snubbing circuit and the first capacitor for preventing charge from flowing from the first capacitor to the snubbing circuit and controlling a rate at which the first capacitor is charged by the snubbing circuit; and a diode and inductor coupled between the first and second capacitors for preventing charge from flowing from the second capacitor to the first capacitor and controlling a rate at which the second capacitor is charged from the first capacitor.

14. A switching circuit in accordance with claim 3 wherein the capacitive storage comprises:

a first capacitor which is coupled to the snubbing circuit having a terminal which has a polarity additive to the DC potential; and a second capacitor, coupled to the first capacitor, which is charged from charge transferred from the first capacitor, and to the DC potential, for providing charge to the at least one switch when a potential stored across the second capacitor is greater than the DC potential.

15. A switching circuit in accordance with claim 14 further comprising:

a control switch disposed between the first and second capacitors which is turned on to provide a path for charge to flow from the first capacitor to the second capacitor and which prevents charge flow from the first capacitor to the second capacitor when the control switch is turned off.

16. A switching circuit in accordance with claim 15 further comprising:

a control circuit for causing the control switch to turn on when the voltage stored on the first capacitor is above a first threshold voltage greater than the DC potential with the second threshold being less than the first threshold.

17. A switching circuit in accordance with claim 16 further comprising:

a diode and inductor coupled between the snubbing circuit and the first capacitor for preventing charge from flowing from the first capacitor to the snubbing circuit and controlling a rate at which the first capacitor is charged by the snubbing circuit; and a diode and inductor coupled between the first and second capacitors for preventing charge from flowing from the second capacitor to the first capacitor and controlling a rate at which the second capacitor is charged from the first capacitor.

18. A switching circuit in accordance with claim 4 wherein the capacitive storage comprises:

a first capacitor which is coupled to the snubbing circuit having a terminal which has a polarity additive to the DC potential; and a second capacitor, coupled to the first capacitor, which is charged from charge transferred from the first capacitor, and to the DC potential, for providing charge to the at least one switch when a potential stored across the second capacitor is greater than the DC potential.

19. A switching circuit in accordance with claim 18 further comprising:

a control switch disposed between the first and second capacitors which is turned on to provide a path for charge to flow from the first capacitor to the second capacitor and which prevents charge flow from the first capacitor to the second capacitor when the control switch is turned off.

20. A switching circuit in accordance with claim 19 further comprising:

a control circuit for causing the control switch to turn on when the voltage stored on the first capacitor is above a first threshold voltage greater than the DC potential with the second threshold being less than the first threshold.

21. A switching circuit in accordance with claim 20 further comprising:

a diode and inductor coupled between the snubbing circuit and the first capacitor for preventing charge from flowing from the first capacitor to the snubbing circuit and controlling a rate at which the first capacitor is charged by the snubbing circuit; and a diode and inductor coupled between the first and second capacitors for preventing charge from flowing from the second capacitor to the first capacitor and controlling a rate at which the second capacitor is charged from the first capacitor.

22. A switching circuit in accordance with claim 5 wherein the capacitive storage comprises:

a first capacitor which is coupled to the snubbing circuit having a terminal which has a polarity additive to the DC potential; and a second capacitor, coupled to the first capacitor, which is charged from charge transferred from the first capacitor, and to the DC potential, for providing charge to the at least one switch when a potential stored across the second capacitor is greater than the DC potential.

23. A switching circuit in accordance with claim 22 further comprising:

a control switch disposed between the first and second capacitors which is turned on to provide a path for charge to flow from the first capacitor to the second capacitor and which prevents charge flow from the first capacitor to the second capacitor when the control switch is turned off.

24. A switching circuit in accordance with claim 23 further comprising:

a control circuit for causing the control switch to turn on when the voltage stored on the first capacitor is above a first threshold voltage greater than the DC potential with the second threshold being less than the first threshold.

25. A switching circuit in accordance with claim 24 further comprising:

a diode and inductor coupled between the snubbing circuit and the first capacitor for preventing charge from flowing from the first capacitor to the snubbing circuit and controlling a rate at which the first capacitor is charged by the snubbing circuit; and a diode and inductor coupled between the first and second capacitors for preventing charge from flowing from the second capacitor to the first capacitor and controlling a rate at which the second capacitor is charged from the first capacitor.

26. In a snubbing circuit coupled to at least one switch for controlling a voltage dropped by the eat least one switch during switching to control current flow through a load an improvement comprising:

a DC potential coupled to the at least one switch which provides current flow to the electrical load during switching of the at least one switch;

a capacitive storage, coupled to the DC potential, for storing charge producing an electrical potential which is added to the DC potential when the potential of the stored charge is higher than the DC potential; and a coupling circuit, coupled to a snubbing circuit, for coupling electrical energy to the capacitive storage which is stored in the snubbing circuit during switching of the at least one switch.

27. A method of operating a snubbing circuit coupled to at least one switch controlling a flow of current through an electrical load comprising:

coupling electrical energy to a capacitive storage which is stored in the snubbing circuit during switching of the at least one switch; and coupling electrical energy stored in the capacitive storage to the at least one switch when a potential at which the electrical energy is stored in the capacitive storage is greater than a DC potential which supplies current flowing to the electrical load which is switched by the at least one switch.

* * * * *

UNITED STATES PATENT AND TRADEMARK OFFICE
CERTIFICATE OF CORRECTION

PATENT NO. : 5,223,779
DATED : June 29, 1993
INVENTOR(S) : Rasappa Palaniappan

It is certified that error appears in the above-identified patent and that said Letters Patent is hereby corrected as shown below:

On the title page, Item [73] please correct the Assignee. Delete "Sundstrand Corporation" and insert therefor --Sullair Corporation--.

Signed and Sealed this

Twenty-fourth Day of May, 1994

Attest:

BRUCE LEHMAN

Attesting Officer     Commissioner of Patents and Trademarks